(12) United States Patent
Pang et al.

(10) Patent No.: US 9,434,553 B2
(45) Date of Patent: Sep. 6, 2016

(54) GLASS SUBSTRATE CONVEYER

(71) Applicants: Boe Technology Group Co., Ltd., Beijing (CN); Beijing Boe Display Technology Co., Ltd., Beijing (CN)

(72) Inventors: Libin Pang, Beijing (CN); Yang Zhao, Beijing (CN); Xuesong Gao, Beijing (CN)

(73) Assignees: Boe Technology Group Co., Ltd., Beijing (CN); Beijing Boe Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/744,156

(22) Filed: Jun. 19, 2015

(65) Prior Publication Data

US 2016/0194159 A1 Jul. 7, 2016

(30) Foreign Application Priority Data

Jan. 4, 2015 (CN) .......................... 2015 1 0001840

(51) Int. Cl.
*B65G 43/00* (2006.01)
*B65G 43/08* (2006.01)
*B65G 13/02* (2006.01)
*B65G 49/06* (2006.01)

(52) U.S. Cl.
CPC ............... *B65G 43/08* (2013.01); *B65G 13/02* (2013.01); *B65G 49/064* (2013.01)

(58) Field of Classification Search
CPC .................................................. B65G 49/064
USPC ................ 198/502.1–502.3; 250/221, 222.1, 250/222.2, 223 R, 223 B
See application file for complete search history.

(56) References Cited

U.S. PATENT DOCUMENTS 5,371,583 A * 12/1994 Yamaguchi ........... F27B 9/2407
250/222.1
7,531,044 B2 * 5/2009 Dickerson ................. B08B 1/02
134/15
8,618,464 B2 * 12/2013 Hoberg ..................... A61L 2/04
250/221
2011/0005903 A1 1/2011 Niewiera

FOREIGN PATENT DOCUMENTS

| CN | 201647179 | 11/2010 |
|---|---|---|
| CN | 103105401 | 5/2013 |
| CN | 103691715 | 4/2014 |
| CN | 103971457 | 8/2014 |
| JP | 2003188239 | 7/2003 |
| JP | 2011-003634 | 1/2011 |

OTHER PUBLICATIONS

Office action from Chinese Application No. 201510001840.4 dated Apr. 27, 2016.

* cited by examiner

*Primary Examiner* — William R Harp
(74) *Attorney, Agent, or Firm* — Calfee, Halter & Griswold LLP

(57) ABSTRACT

The present invention relates to the technical field of display, and discloses a glass substrate conveyer. The glass substrate conveyer comprises a rack, a conveying member mounted on the rack, a power system for driving the conveying member, a light sensing system mounted below the conveying member, and a controller connected with the power system. According to the present invention, the broken glass substrate can be easily found in time.

7 Claims, 5 Drawing Sheets

GLASS SUBSTRATE CONVEYER

RELATED APPLICATIONS

The present application claims the benefit of Chinese Patent Application No. 201510001840.4, filed Jan. 4, 2015, the entire disclosure of which is incorporated herein by reference.

TECHNICAL FIELD

The present invention relates to the technical field of display, and particularly relates to a glass substrate conveyer.

BACKGROUND ART

A glass substrate serves as a matrix of a TFT-LCD (thin film transistor-liquid crystal display), and a specific pattern is formed on the substrate surface. In a production process, there is a need for conveying the glass substrate to a specific position by using a glass substrate conveyer. Because the glass substrate is only 0.5 mm thick or even thinner, during conveying, contact impact between the glass substrate and conveying rolls of the conveyer may usually cause breakage or damage of the glass. Because positions, at which the glass is damaged, on the conveyer are not fixed, it is hard to find the broken glass substrate and stop the equipment in time, thus easily causing a result that broken glass fragments enter the equipment and damage it. Meanwhile, the glass substrate is made of a transparent material, such that the fragments thereof are difficult to find in the first place on a production line.

Therefore, there is a need for a glass substrate conveyer capable of easily finding a broken glass substrate while on the line.

SUMMARY OF THE INVENTION

An objective of the present invention is to provide a glass substrate conveyer capable of easily finding a broken glass substrate in time.

To solve the above technical problem, the present invention provides a glass substrate conveyer, comprising a rack, a conveying member mounted on the rack, a power system for driving the conveying member, a light sensing system mounted below the conveying member, and a controller connected with the power system, wherein the conveying member comprises a conveying belt mounted on the rack and a plurality of conveying rolls which are sequentially horizontally mounted on the rack, and any two adjacent conveying rolls are mutually parallel and have a gap therebetween, thereby forming a rectangular conveying member; the light sensing system comprises a plurality of light sensing units, the plurality of light sensing units are sequentially arranged below at least one pair of opposite sides of the conveying member and the arrangement direction thereof is parallel to the corresponding sides of the conveying member, and light rays from the light sensing units below the same pair of opposite sides are mutually parallel, for detecting glass fragments falling off the broken glass substrate; and the controller is respectively connected with individual light sensing units to receive and process signals from the light sensing units as well as send a control signal to the power system according to a processing result.

In an embodiment, each light sensing unit comprises two portions respectively mounted below two opposite sides of the conveying member.

In an embodiment, the two portions are respectively a laser distance sensor and a reflective baffle. The laser distance sensor detects a distance from the nearest object. The controller is connected with the laser distance sensor, to receive a distance signal detected by the laser distance sensor and send a control signal to the power system if the received distance signal is less than a standard distance signal. The standard distance signal indicates a distance, which is detected by the laser distance sensor, from the reflective baffle.

In an embodiment, light rays from the light sensing units are parallel to axial directions of the conveying rolls or light rays from the light sensing units are perpendicular to axial directions of the conveying rolls.

In an embodiment, the two portions are respectively a light transmitter and a light receiver, and the controller is connected with the light receiver. The light receiver receives a light signal transmitted by the light transmitter, and transfers the light signal to the controller. The controller sends a control signal to the power system when it is detected that the light signal received by any receiver is interrupted.

In an embodiment, the light sensing units below the same pair of opposite sides are arranged equidistantly.

In an embodiment, a fragment collector is arranged below the conveying member.

In an embodiment, the glass substrate conveyer further comprises a display, which is connected with the controller, for displaying signals detected by the light sensing units.

In an embodiment, the glass substrate conveyer further comprises an alarm apparatus, which is connected with the controller, for sending out an alarm.

According to the glass substrate conveyer provided by the present invention, the light sensing system is formed by the light sensing units sequentially linearly arranged below one or two pairs of opposite sides of the rectangular conveying member, so that falling of the glass fragments is detected by using the light sensing system, and the detected signals are sent to the controller to shut off the power system. Thereby, a worker can easily find the broken glass substrate and the reason for this breakage in time, then process the broken glass substrate and ensure the conveyed glass substrate is not broken. In addition, through arranging a fragment collector, the glass fragments can be collected, so that the transparent glass fragments are prevented from scattering and damaging the production equipment.

DETAILED DESCRIPTION OF THE INVENTION

Figure 1:
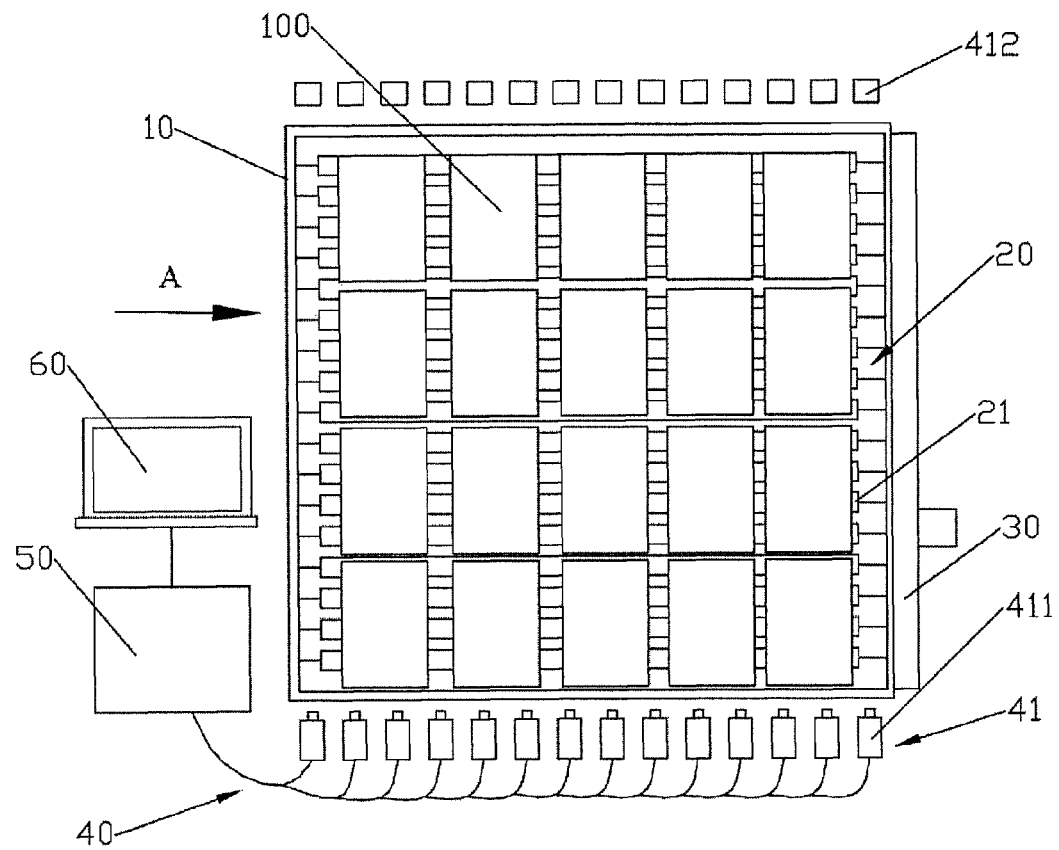
FIG. 1 is a top view according to a first embodiment of the present invention.

Hereinafter, a detailed description of the present invention will be explained in detail in conjunction with the accompanying drawings and embodiments. The following embodiments are intended to illustrate but not limit the scope of the present invention.

The following is a list of reference characters used in the drawings, 10: rack; 20: conveying member; 21: conveying roll; 30: power system; 40: light sensing system; 41: light sensing unit; 411: laser distance sensor; 412: reflective baffle; 4120: baffle assembly; 413: light transmitter; 414: light receiver; 50: controller; 60: display; 70: fragment collector; 100: glass substrate.

A First Embodiment

Figure 2:
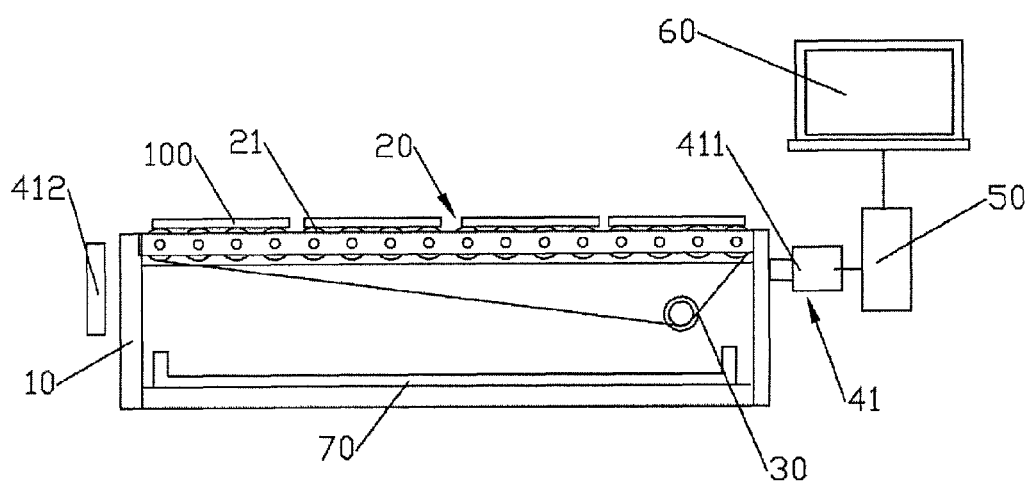
FIG. 2 is a cross-sectional view along the direction A in FIG. 1.

With reference to FIG. 1 and FIG. 2, the glass substrate conveyer according to the present invention comprises a rack 10, a conveying member 20 mounted on the rack 10, a power system 30 for driving the conveying member 20, a light sensing system 40 mounted below the conveying member 20, and a controller 50 connected with the power system 30. The conveying member 20 comprises a conveying belt mounted on the rack and a plurality of conveying rolls 21 which are sequentially horizontally mounted on the rack 10, and any two adjacent conveying rolls 21 are mutually parallel and have a gap therebetween, thereby forming a rectangular conveying member. The power system 30 may comprise a servo motor and a speed reducer, and the servo motor is respectively connected with each conveying roll 21 through the speed reducer and drives a plurality of conveying rolls 21 to rotate at the same speed. The light sensing system 40 comprises a plurality of light sensing units 41, the plurality of light sensing units 41 are sequentially arranged below at least one pair of opposite sides of the rectangular conveying member and the arrangement direction thereof is parallel to the corresponding sides of the conveying member 20, and light rays from the light sensing units 41 below the same pair of opposite sides are mutually parallel, for detecting glass fragments falling off a broken glass substrate. The controller 50 is respectively connected with individual light sensing units 41 to receive and process signals from the light sensing units 41 as well as send a control signal to the power system 30 according to a processing result, so as to shut off the power system.

Figure 3:
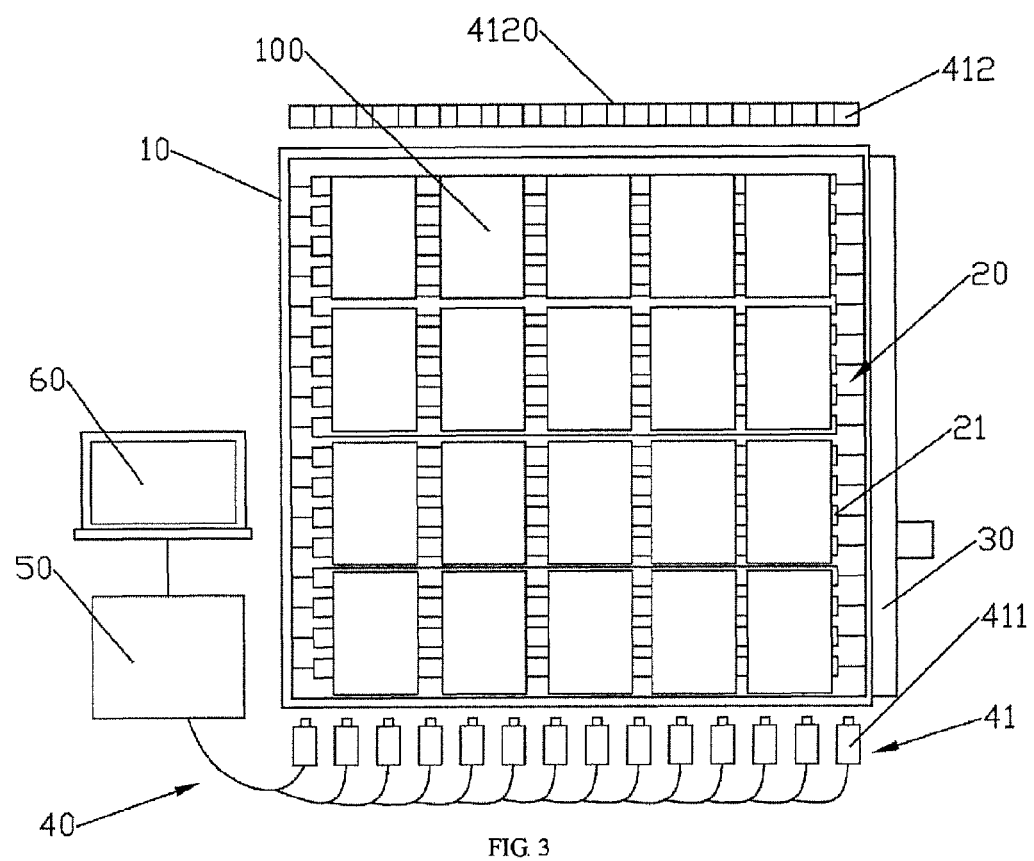
FIG. 3 is another top view according to the first embodiment of the present invention.

With reference to FIG. 1 and FIG. 2, in this embodiment, a plurality of light sensing units 41 are sequentially arranged below one pair of opposite sides of the conveying member. Each light sensing unit 41 comprises two portions: a laser distance sensor 411 and a reflective baffle 412. The laser distance sensors 411 and the reflective baffles 412 are respectively mounted below two opposite sides of the conveying member 20. In this embodiment, light rays from the light sensing units 41 are parallel to axial directions of the conveying rolls 21, and the laser distance sensors 411 are mounted at the same side, for detecting a distance from the nearest object. The controller 50 is connected with the laser distance sensors 411 to receive distance signals detected by the laser distance sensors 411 and send a control signal to the power system 30 if the received distance signals are less than a standard distance signal, so as to shut off the power system 30. The standard distance signal indicates a distance, which is detected by the laser distance sensors 411, from the reflective baffle 412. With reference to FIG. 3, for ease of mounting, the reflective baffles 412 are mutually connected to form a bar-shaped baffle assembly 4120.

When the glass substrate conveyer is used, the conveying member 20 conveys glass substrates 100 under the drive of the power system 30. Meanwhile, the laser distance sensors 411 are turned on to detect a distance signal from the nearest object. When the glass substrate 100 is broken, glass fragments may fall from the gaps among conveying rolls 21 of the conveying member 20. When the glass fragments pass the laser detection lines of the laser distance sensors 411, at least one laser distance sensor 411 detects distances from the glass fragments, and sends the detected distance signals to the controller 50. The controller 50 compares the detected distance signals with a standard distance signal, and sends a control signal to the power system 30 if the detected distance signals are less than the standard distance signal, so as to shut off the power system 30. After the power system 30 is shut off, a worker can easily clean the broken glass substrate 100 in time, and then restarts the power system 30 to continuously convey the glass substrates 100. By using the glass substrate conveyer provided by the present invention, the worker can easily find the broken glass substrate and the reason for this breakage in time, then process the broken glass substrate and ensure the conveyed glass substrate is not broken.

Further, the light sensing units 41 below the same pair of opposite sides are arranged equidistantly. The equidistantly-arranged light sensing units can detect the fragments falling off the broken glass substrate much better, thereby improving the detection accuracy.

Further, a fragment collector 70 is arranged below the conveying member 20. Because the glass substrates 100 are made of transparent materials, the fragments are not easily collected. Through arranging the fragment collector 70, fragments of the glass substrates 100 will easily fall into the collector 70, thus making the collection more convenient.

Figure 4:
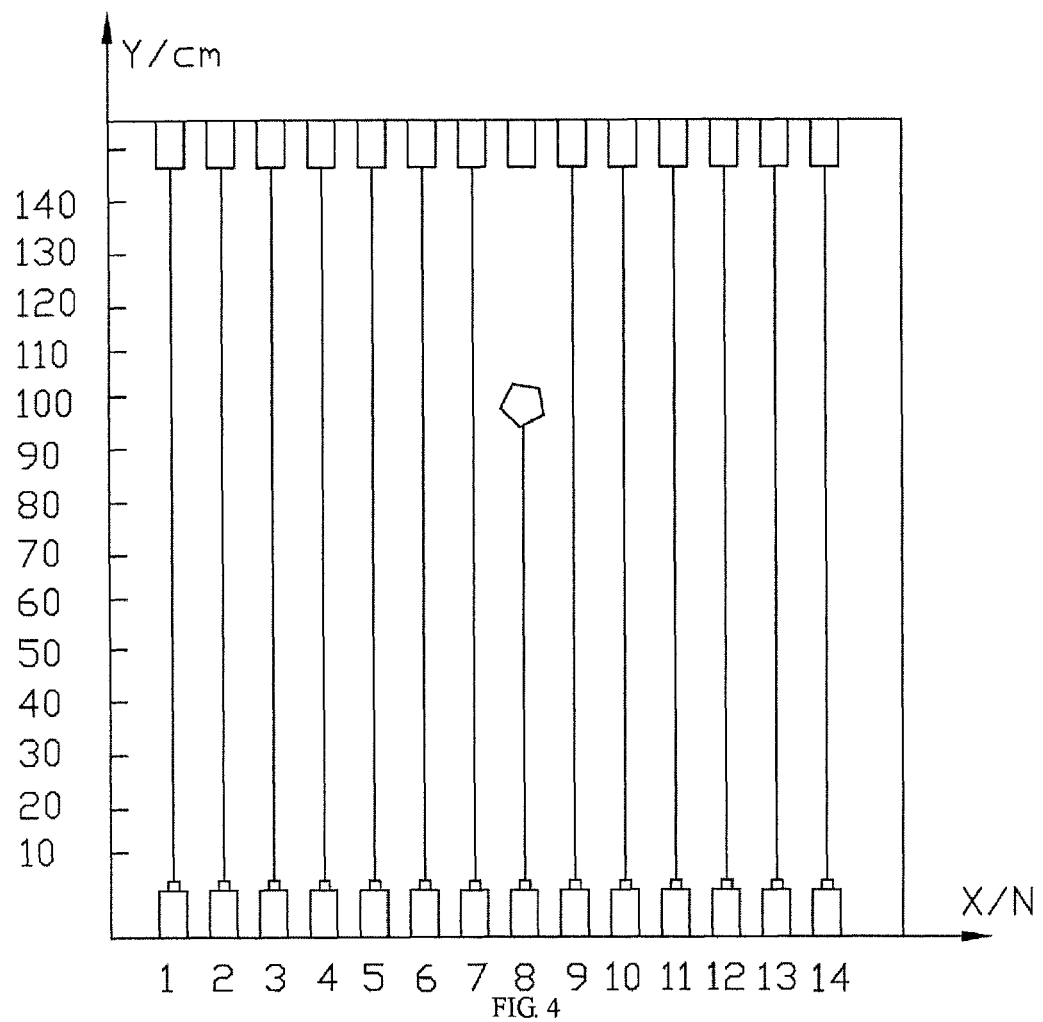
FIG. 4 is a schematic display view when glass fragments are detected according to the first embodiment of the present invention.

Further, with reference to FIG. 1 and FIG. 2, the glass substrate conveyer further comprises a display 60. The display 60 is connected with the controller 50 for displaying signals detected by the light sensing units 41. The display 60 of the glass substrate conveyer provided by the present invention displays a distance sensing coordinate system as shown in FIG. 4, wherein the horizontal coordinate represents the serial number of a plurality of sequentially arranged laser distance sensors 411, and the vertical coordinate represents distance signals detected by the laser distance sensors 411. When the glass substrates 100 on the conveying bet 20 are broken and glass fragments fall down, distances from the glass fragments are detected by at least one laser distance sensor 411, and the respective distance signals are sent to the controller 50. Then, the controller 50 sends the detected distance signals to the display 60 for display. As shown in FIG. 4, when the glass fragments fall down, the display 60 shows that the distance signal which is detected by the eighth laser distance sensor 411 is less than the standard distance signal. Therefore, the worker can quickly find an approximate position of the broken glass substrate 100 according to the displayed content. Preferably, the display 60 receives the control signal from the controller 50 and records a display frame, thereby facilitating the worker to review a display record.

Further, the glass substrate conveyer further comprises an alarm apparatus (not shown in figures). The alarm apparatus is connected with the controller 50 for sending out an alarm.

Except for being parallel to axial directions of the conveying rolls 21, light rays from the light sensing units 41 may also be set to be perpendicular to the axial directions of the conveying rolls 21.

Further, to improve the detection precision, the plurality of light sensing units 41 are sequentially arranged below two pairs of opposite sides of the conveying member 20. That is, two mutually perpendicular and overlapped distance sensing coordinate systems are formed below the rectangular conveying member 20.

A Second Embodiment

Figure 5:
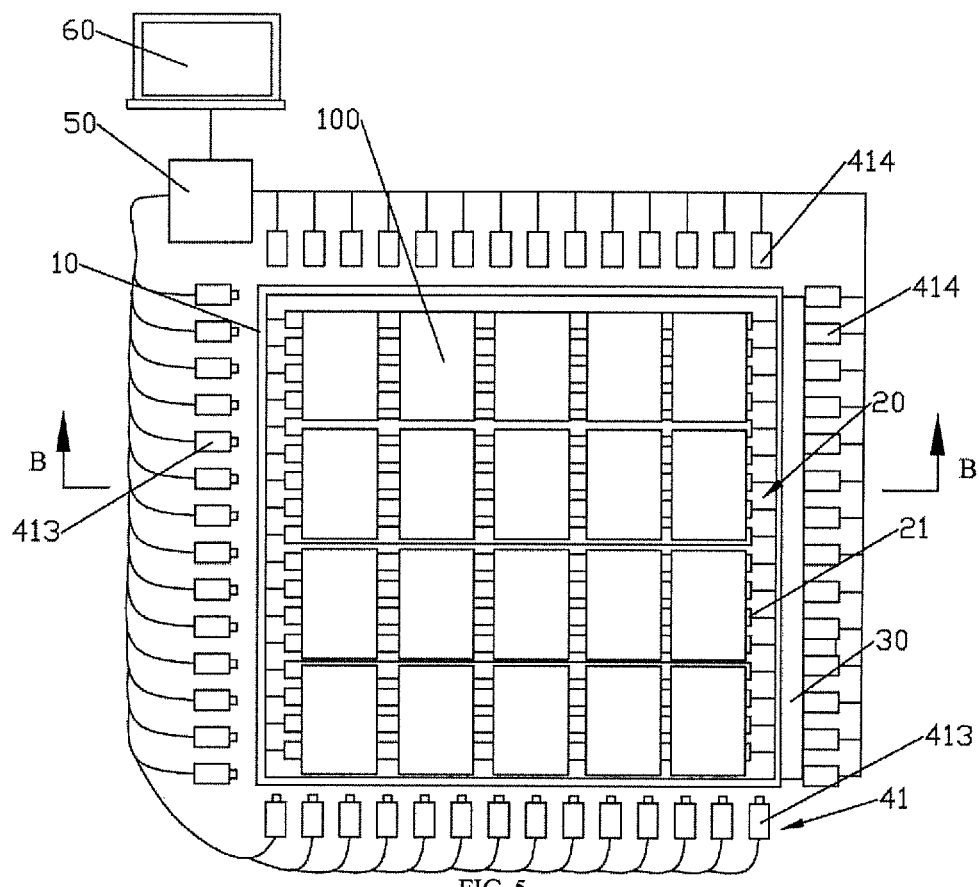
FIG. 5 is a top view according to a second embodiment of the present invention.
Figure 6:
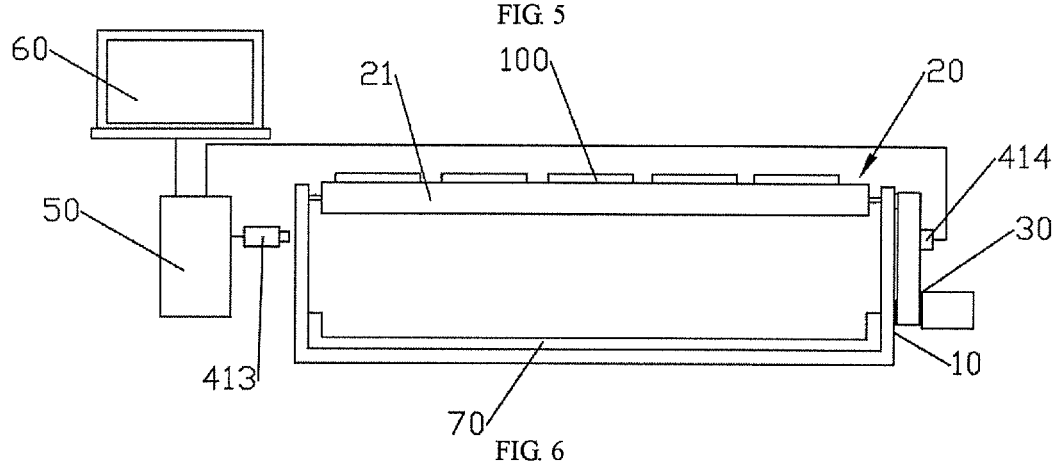
FIG. 6 is a cross-sectional view along the direction B-B in FIG. 5.

With reference to FIG. 5 and FIG. 6, this embodiment is basically identical to the first embodiment as shown in FIG. 1 and FIG. 2, except for the differences: (1) a plurality of light sensing units 41 are sequentially arranged below two pairs of opposite sides of the conveying member 20; and (2) each light sensing unit 41 comprises two portions: a light transmitter 413 and a light receiver 414. The light transmitter 413 and the light receiver 414 are respectively mounted below two opposite sides of the conveying member 20. The controller 50 is connected with the light receiver 414. The light receiver 414 receives a light signal transmitted by the light transmitter 413, and transfers this light signal to the controller 50. The controller 50 sends a control signal to the power system 30 when detected that the light signal received by any light receiver 414 is interrupted. In particular, the light transmitter 413 is also connected with the controller 50, and the controller 50 controls the light transmitter 413 to turn on or turn off. Infrared ray light sensors may be used as the light transmitter 413 and the light receiver 414.

When the glass substrate conveyer is used, the conveying member 20 conveys the glass substrates 100 under the drive of the power system 30. The controller 50 turns on the light transmitter 413, then the light receiver 414 receives a light signal and sends this light signal to the controller. When the glass substrate 100 is broken and glass fragments fall down, the light rays are blocked from propagating, and at least one light receiver 414 will not receive the light signal. At this moment, the controller 50 detects that the light signal received by the light receiver 414 is interrupted, and send a control signal to the power system 30.

Figure 7:
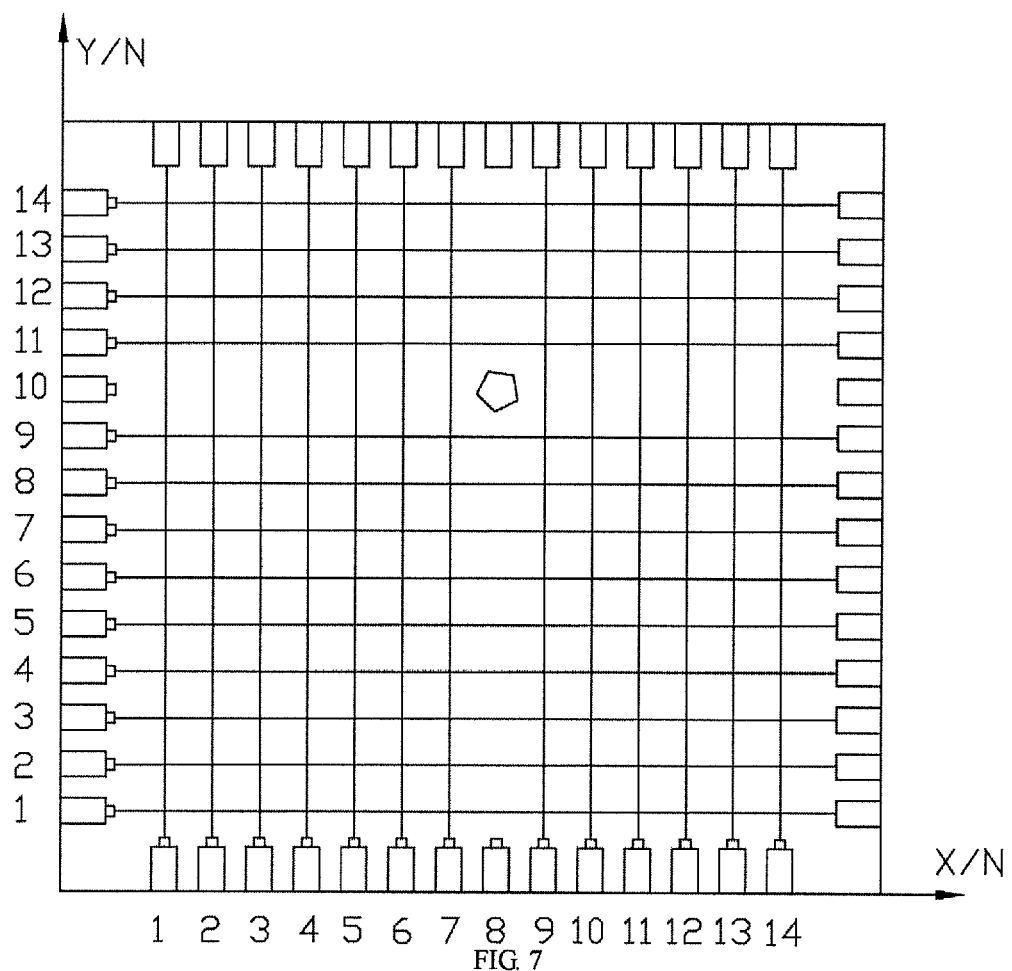
FIG. 7 is a schematic display view when glass fragments are detected according to the second embodiment of the present invention.

When the display 60 is connected with the controller 50, the display 60 displays light signals received by the light receivers. With reference to FIG. 7, a gird sensing coordinate system is shown, wherein various horizontal and vertical lines respectively represent light signals received by the light receivers 414 arranged below two adjacent sides of the conveying member 20, and the horizontal and vertical coordinate respectively represent the serial number of these light receivers 414. When the glass fragments fall down and penetrate through the grid sensing coordinate system, one horizontal and one vertical line will be interrupted, and the intersection point of these interrupted horizontal and vertical lines is the position where the glass fragments fall down. Therefore, a worker can quickly find the position of the broken glass substrate with this displayed image.

Further, in this embodiment, a plurality of light sensing units 41 may be only arranged below one pair of opposite sides of the conveying member 20.

The foregoing embodiments are merely preferred embodiments of the present invention, and not intended to limit the present invention. Any modifications, equivalent substitutions, improvements and the like made within the spirit and principle of the present invention should all fall within a protective scope of the present invention.

The invention claimed is:

1. A glass substrate conveyer, comprising: a rack, a conveying member mounted on said rack, a power system for driving said conveying member, as light sensing system mounted below said conveying member, and a controller connected with said power system, wherein
   said conveying member comprises a conveying belt mounted on said rack and a plurality of conveying rolls which are sequentially horizontally mounted on said rack, and any two adjacent conveying rolls are mutually parallel and have a gap therebetween, thereby forming a rectangular conveying member;
   said light sensing system comprises a plurality of light sensing units, the plurality of light sensing units are sequentially arranged below at least one pair of opposite sides of said conveying member and the arrangement direction thereof is parallel to the corresponding sides of said conveying member, and light rays from the light sensing units below the same pair of opposite sides are mutually parallel, for detecting glass fragments falling off a broken glass substrate; and
   said controller is respectively connected with individual light sensing units to receive and process signals from the light sensing units as well as send a control signal to said power system according to a processing result, and wherein
   each light sensing unit comprises two portions respectively mounted below two opposite sides of said conveying member,
   said two portions being respectively a laser distance sensor and a reflective baffle, wherein
   said laser distance sensor detects a distance from the nearest object, and
   said controller is connected with said laser distance sensor to receive a distance signal detected by said laser distance sensor and send a control signal to the power system if the received distance signal is less than a standard distance signal, said standard distance signal indicating a distance, which is detected by said laser distance sensor, from the reflective baffle.

2. The glass substrate conveyer according to claim 1, wherein light rays from said light sensing units are parallel to axial directions of said conveying rolls or light rays from said light sensing units are perpendicular to axial directions of said conveying rolls.

3. The glass substrate conveyer according to claim 1, wherein said two portions are respectively a light transmitter and a light receiver, and said controller is connected with the light receiver, wherein
   said light receiver receives a light signal transmitted by said light transmitter, and transfers the light signal to said controller, and
   said controller sends a control signal to the power system when detected that the light signal received by any receiver is interrupted.

4. The glass substrate conveyer according to claim 1, wherein the light sensing units below the same pair of opposite sides are arranged equidistantly.

5. The glass substrate conveyer according to claim 1, wherein a fragment collector is arranged below said conveying member.

6. The glass substrate conveyer according to claim 1, further comprising a display, which is connected with said controller, for displaying signals detected by said light sensing units.

7. The glass substrate conveyer according to claim 1, further comprising an alarm apparatus, which is connected with said controller, for sending out an alarm.

* * * * *